United States Patent
Ham (10) Patent No.: US 9,203,398 B2
(45) Date of Patent: Dec. 1, 2015

(54) CONTROLLER OF MULTI CIRCUIT LOAD BREAK SWITCH FOR ELECTRIC POWER DISTRIBUTION

(71) Applicant: LSIS CO., LTD., Anyang-si, Gyeonggi-do (KR)

(72) Inventor: Sung Sik Ham, Cheongju-si (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 436 days.

(21) Appl. No.: 13/904,983

(22) Filed: May 29, 2013

(65) Prior Publication Data

US 2013/0328413 A1    Dec. 12, 2013

(30) Foreign Application Priority Data

Jun. 11, 2012   (KR) .................. 10-2012-0062291

(51) Int. Cl.
*H01H 19/64*   (2006.01)
*H03K 17/56*   (2006.01)

(52) U.S. Cl.
CPC ............. *H03K 17/56* (2013.01); *Y10T 307/747* (2015.04)

(58) Field of Classification Search
CPC ........................... Y10T 307/747; H03K 17/56
USPC ........................................................ 307/113
See application file for complete search history.

(56) References Cited

U.S. PATENT DOCUMENTS

| 6,160,690 A | * | 12/2000 | Matsumoto | .......... | H02H 1/0061 |
| | | | | | 361/62 |
| 6,539,287 B1 | * | 3/2003 | Ashizawa | .............. | H02H 7/263 |
| | | | | | 361/59 |
| 6,804,828 B1 | * | 10/2004 | Shibata | ..................... | H01P 1/10 |
| | | | | | 333/101 |

FOREIGN PATENT DOCUMENTS

| CN | 101267128 | 9/2008 |
| CN | 101908029 | 12/2010 |
| CN | 202059223 | 11/2011 |
| JP | 2008-228427 | 9/2008 |

OTHER PUBLICATIONS

The State Intellectual Property Office of the People's Republic of China Application Serial No. 201310233768.9, Office Action dated Dec. 3, 2014, 5 pages.

* cited by examiner

*Primary Examiner* — Jared Fureman
*Assistant Examiner* — Duc M Pham
(74) *Attorney, Agent, or Firm* — Lee, Hong, Degerman, Kang & Waimey (57) ABSTRACT

A control device of a multi circuit load break switch according to the disclosure may include a first multiplexer selectively providing an output signal according to a remote close signal or remote open signal; a field closing switch selectively commanding a close operation; a field opening switch selectively commanding an open operation thereof; a second multiplexer selectively providing a field closing switch actuation signal or field opening switch actuation signal; a first exclusive-OR circuit unit outputting an open control signal; a second exclusive-OR circuit unit outputting a close control signal; an open command signal generation unit releasing an open command signal; a close command signal generation unit; a first photo coupler providing an open state signal to the open command signal generation unit; and a second photo coupler providing a close state signal to the close command signal generation unit.

6 Claims, 3 Drawing Sheets

CONTROLLER OF MULTI CIRCUIT LOAD BREAK SWITCH FOR ELECTRIC POWER DISTRIBUTION

CROSS-REFERENCE TO RELATED APPLICATION

Pursuant to 35 U.S.C. §119(a), this application claims the benefit of earlier filing date and right of priority to Korean Patent Application No. 10-2012-0062291, filed on Jun. 11, 2012, the contents of which is incorporated by reference herein in its entirety.

BACKGROUND OF THE INVENTION

1. Field of the Invention

The present invention relates to a multi circuit load break switch, and more particularly, to a multi circuit load break switch configured with transistor-transistor logic (hereinafter, referred to as "TTL") circuit elements that configuration is simple and can be fabricated with low cost.

2. Description of the Conventional Art

A multi circuit load break switch is power equipment used for the purpose of branching lines in transmission level high voltage distribution lines of several ten thousand voltage such as 22.9 kilovolt (kV) in power plants and substations.

Figure 1:
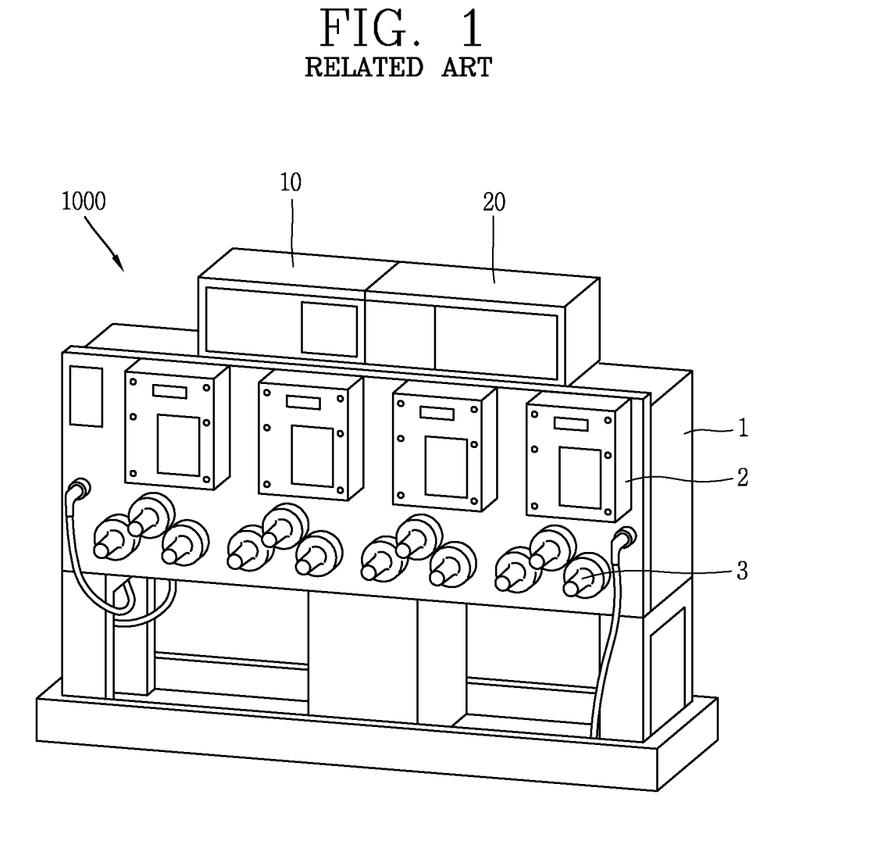
FIG. 1 is a perspective view illustrating the external appearance configuration of a multi circuit load break switch including a control device according to the related art.

Referring to FIG. 1, the multi circuit load break switch 1000 may be largely divided into mechanical devices including a switch 1 configured to switch a circuit to a feeding position, a breaking position or ground position and a switch actuator 2 configured to open or close three phases circuits simultaneously and switching the switch 1, and a control device configured to control the mechanical device.

Reference numeral 3 in FIG. 1 indicates a terminal bushing. As well known, the terminal bushing 3 is configured such that an electrical conductor terminal is embedded in a conical shaped insulator.

The control device can be a communication terminal device 10 and a switching control device 20 capable of opening or closing the multi circuit switch from a remote location.

An example of the circuit configuration of the control device according to the related art will be described with reference to FIG. 2.

The circuit configuration and operation of a control device will be described with reference to FIG. 2.

Figure 2:
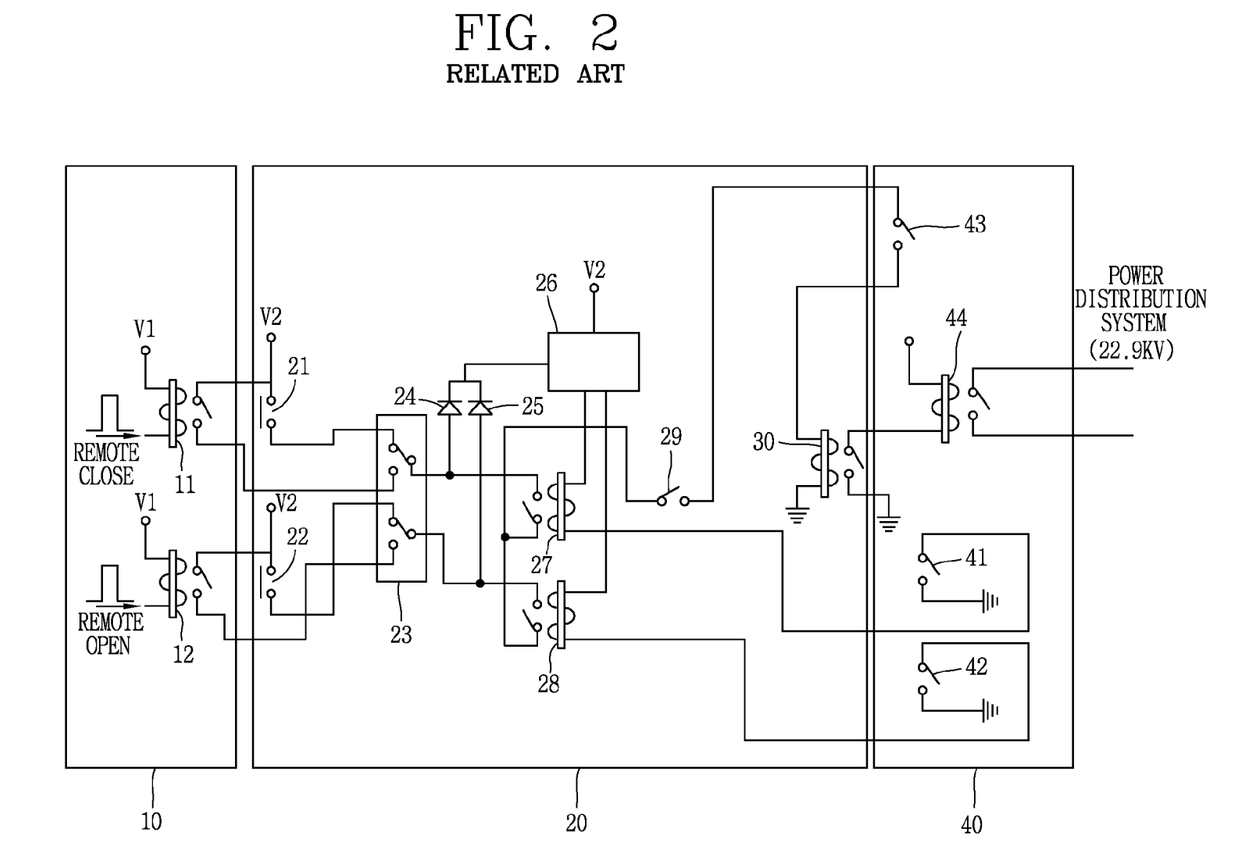
FIG. 2 is a circuit diagram illustrating the circuit configuration of a control device of a multi circuit load break switch according to the related art.

In FIG. 2, reference numeral 40 indicates a switch actuator circuit unit wherein a main relay 44 configured to supply or break an electric power for driving a motor as a switch actuator (refer to reference numeral 2 in FIG. 1), for instance, is a main constituent element. In FIG. 2, the switch actuator circuit unit 40 may further include an open state detection contact 41 and a closed state detection contact 42 for detecting the operation state of the switch 1, namely, an open state and a closed state, respectively. Furthermore, the switch actuator circuit unit 40 may further include a gas pressure drop detection contact 43. The gas pressure drop detection contact 43 may be configured with a normal closed contact switch configured to be open when an insulation gas pressure within the switch 1 is less than a predetermined allowable reference value and closed when it is normal.

In FIG. 2, the circuit configuration of the communication terminal device 10 will be first described.

The communication terminal device 10 may include a remote close command relay 11 and a remote open command relay 12.

The remote close command relay 11 is closed by a remote close signal (signal for remotely commanding a circuit close operation of the switch) transmitted in a pulse signal form from a monitoring device (not shown) at a remote place to perform a function for converting the remote close signal into a large-capacity direct current (abbreviated DC hereinafter) electric power source voltage (V2) signal.

Here, the large-capacity DC electric power source voltage (V2) as a relatively large DC voltage such as DC 24 volts is an operating voltage used to drive the switching control device 20 and switch actuator circuit unit 40.

The remote close command relay 11 is a close command relay having a coil magnetized by a small-capacity DC electric power source voltage (V1) and a contact closed or open according to the magnetization or demagnetization of the coil.

The remote open command relay 12 is closed in response to a remote close signal (signal for remotely commanding a circuit open operation of the switch) transmitted in a pulse signal form from a monitoring device (not shown) at a remote place to perform a function for converting the remote open signal into a large-capacity DC electric power source voltage (V2) signal.

The remote open command relay 12 is an open command relay having a coil magnetized by a small-capacity DC electric power source voltage (V1) and a contact closed or open according to the magnetization or demagnetization of the coil.

The circuit configuration of the switching control device 20 will be described with reference to FIG. 2.

The switching control device 20 may include a field closing switch 21, a field opening switch 22, a field/remote selection switch 23, a trigger relay 26, a closing relay 27, an opening relay 28, and an terminal output relay 30.

The field closing switch 21 is a switch for allowing the user to directly command the closing of the multi circuit load break switch, namely, a switching operation to a closed position at a field where the multi circuit load break switch is installed, and is connected to a voltage source of the large-capacity DC electric power source voltage (V2).

The field opening switch 22 is a switch for allowing the user to directly command the opening of the multi circuit load break switch, namely, an switching operation to an open position at a field where the multi circuit load break switch is installed, and is connected to a voltage source of the large-capacity DC electric power source voltage (V2).

The field closing switch 21 and field opening switch 22 may be configured by a push button switch.

The field/remote selection switch 23 is a selection switch for selecting whether the position manipulation of closing and opening the multi circuit load break switch is carried out by field manipulation or carried out by remote control. The field/remote selection switch 23 may be configured by two C-contact switches, and each C-contact switch has two input terminals, which are connected to the remote close command relay 11 and field closing switch 21 or the remote open command relay 12 and field opening switch 22, respectively, and the output terminal of each C-contact switch is one. The field/remote selection switch 23 transfers a signal of the large-capacity DC electric power source voltage (V2) from the remote close command relay 11, remote open command relay 12, field closing switch 21 or field opening switch 22 to the closing relay 27 or opening relay 28.

The state of the field/remote selection switch 23 illustrated in FIG. 2 is in a state that a C-contact switch connected to the remote close command relay 11 and remote open command relay 12 is selected to be connected to the field closing switch 21, and in a state that a C-contact switch connected to the remote open command relay 12 and field opening switch 22 is also selected and manipulated to be connected to the field opening switch 22.

Upon receiving a signal of the large-capacity DC electric power source voltage (V2), the trigger relay 26 transfers the signal to the closing relay 27 or opening relay 28, and demagnetizes the coil of the closing relay 27 or opening relay 28 using the signal of the large-capacity DC electric power source voltage (V2) when the open state detection contact 41 or closed state detection contact 42 of the switch actuator circuit unit 40 is closed.

Furthermore, the trigger relay 26 includes a timer for providing a predetermined period of time therewithin to automatically terminate transferring the signal of the large-capacity DC electric power source voltage (V2) to the closing relay 27 or opening relay 28 to protect the motor not to be damaged, which is a switch actuator, unless the open state detection contact 41 or closed state detection contact 42 is closed for the predetermined period of time subsequent to transferring the signal of the large-capacity DC electric power source voltage (V2), namely, when a malfunction of the open state detection contact 41 or the closed state detection contact 42 occurs. Accordingly, the coil of the relevant closing relay 27 or opening relay 28 can be demagnetized.

The closing relay 27 may include a coil connected to one output terminal of the trigger relay 26 and a contact closed or open according to the magnetization or demagnetization of the coil. Here, the input terminal of the contact is connected to an output terminal of the C-contact switch connected to the remote open command relay 12 and field opening switch 22 of the field/remote selection switch 23.

One terminal of the coil of the closing relay 27 is connected to one output terminal of the trigger relay 26, and the other terminal of the coil is connected to the open state detection contact 41.

The closing relay 27 is magnetized by a signal of the large-capacity DC electric power source voltage (V2) from the trigger relay 26 in a state that the open state detection contact 41 is closed (namely, in a state that the switch is currently open), and demagnetized when there does not exist the signal or in a state that the open state detection contact 41 is open (namely, in a state that the switch is currently closed).

The opening relay 28 may include a coil connected to the other output terminal of the trigger relay 26 and a contact closed or open according to the magnetization or demagnetization of the coil. Here, the input terminal of the contact is connected to an output terminal of the C-contact switch connected to the remote open command relay 12 and field opening switch 22 of the field/remote selection switch 23.

One terminal of the coil of the opening relay 28 is connected to one output terminal of the trigger relay 26, and the other terminal of the coil is connected to the closed state detection contact 42.

The opening relay 28 is magnetized by a signal of the large-capacity DC electric power source voltage (V2) from the trigger relay 26 in a state that the closed state detection contact 42 is closed (namely, in a state that the switch is currently closed), and demagnetized when there does not exist the signal or in a state that the closed state detection contact 42 is open (namely, in a state that the switch is currently open).

The terminal output relay 30 as a final output relay of the switching control device 20 is connected to the contacts of the closing relay 27 and the opening relay 28. The terminal output relay 30 is magnetized by a signal of the large-capacity DC electric power source voltage (V2) provided from the contact of the closing relay 27 or the opening relay 28 and demagnetized when there does not exist the signal.

The switching control device 20 may further include a closing diode 24, an opening diode 25 and a restriction switch 29.

Referring to FIG. 2, the closing diode 24 and opening diode 25 are connected between an output terminal of the field/remote selection switch 23 and an input terminal of the trigger relay 26 to transfer a signal of the large-capacity DC electric power source voltage (V2) from the field/remote selection switch 23 to the input terminal of the trigger relay 26.

The restriction switch 29 as a switch for allowing the user to break a control output from the switching control device 20 has an input terminal connected to an output terminal of the contacts of the closing relay 27 and opening relay 28 and an output terminal connected to the gas pressure drop detection contact 43.

The restriction switch 29 breaks the control output from the switching control device 20 when the user manipulates the switch 29 to an open position, and normally transfers the control output from the switching control device 20 to the terminal output relay 30 through the gas pressure drop detection contact 43 when the user manipulates the switch 29 to a closed position.

The operation of the control devices 10, 20 and the switch actuator circuit unit 40 in a multi circuit load break switch having the foregoing configuration according to the related art will be described below.

First, the operation of controlling the remote opening of the switch 1 in a state that the switch 1 of the multi circuit load break switch is currently in a closed state and the user selectively manipulates a C-contact switch connected to the remote open command relay 12 and field opening switch 22 of the field/remote selection switch 23 to be connected to the remote open command relay 12 (in a state that the location illustrated in FIG. 2 is manipulated to be switched to the other position) will be described.

When a remote opening signal transmitted in a pulse signal form from the monitoring device (not shown) is transmitted, a contact of the remote open command relay 12 is closed in response to the remote opening signal to convert the remote opening signal into a signal of the large-capacity DC electric power source voltage (V2).

Then, a signal of the corresponding large-capacity DC electric power source voltage (V2) for commanding the open operation of the switch 1 is transferred to the trigger relay 26 through a C-contact switch connected to the remote open command relay 12 and field opening switch 22 at a lower portion of the field/remote selection switch 23 in the drawing and the opening diode 25.

Since the switch 1 is currently in a closed state, the trigger relay 26 outputs a signal of the large-capacity DC electric power source voltage (V2) in a state that the closed state detection contact 42 is closed to magnetize the coil of the opening relay 28 and thus magnetizes the coil of the terminal output relay 30 through the restriction switch 29 and gas pressure drop detection contact 43 in which the signal of the large-capacity DC electric power source voltage (V2) for commanding remote open is closed while closing the contact of the opening relay 28.

Accordingly, the signal of the large-capacity DC electric power source voltage (V2) is supplied to the main relay 44 while closing the contact of the terminal output relay 30. At this time, the restriction switch 29 is in a closed position as far as the user does not manipulate it to an open position to prohibit the control output, and the gas pressure drop detection contact 43 is located at a closed position as far as an insulation gas pressure within the switch 1 is not reduced to less than a preset pressure.

As a result, electric power is supplied to the motor (not shown) which is an opening actuator while the coil of the main relay 44 is magnetized and the contact is closed, and the switch 1 in FIG. 1 is operated to an open position by the driving of the motor, thereby completing the command operation.

Next, the operation of controlling the field opening of the switch 1 in a state that the switch 1 of the multi circuit load break switch is currently in a closed state and the user selectively manipulates a C-contact switch connected to the remote open command relay 12 and field opening switch 22 of the field/remote selection switch 23 to be connected to the field opening switch 22 as illustrated in the state of FIG. 2 will be described.

When the user presses the field opening switch 22 to close the contact, the signal of the large-capacity DC electric power source voltage (V2) for commanding the open operation of the switch 1 is transferred to the trigger relay 26 through a C-contact switch connected to the remote open command relay 12 and field opening switch 22 at a lower portion of the field/remote selection switch 23 in the drawing and the opening diode 25, and the subsequent operation will be carried out in a similar manner to the foregoing operation of controlling the remote opening of the switch 1, and thus the description of redundant description will be omitted.

Next, the operation of controlling the field closing of the switch 1 in a state that the switch 1 of the multi circuit load break switch is currently in an open state and the user selectively manipulates a C-contact switch connected to the remote close command relay 11 and field closing switch 21 of the field/remote selection switch 23 to be connected to the field closing switch 21 as illustrated in the state of FIG. 2 will be described.

When the user presses the field closing switch 21 to close the contact, the signal of the large-capacity DC electric power source voltage (V2) for commanding the close operation of the switch 1 is transferred to the trigger relay 26 through a C-contact switch connected to the remote close command relay 11 and field closing switch 21 at an upper portion of the field/remote selection switch 23 in the drawing and the closing diode 24.

Since the switch 1 is currently in an open state, the trigger relay 26 outputs a signal of the large-capacity DC electric power source voltage (V2) in a state that the closed state detection contact 42 is closed to magnetize the coil of the closing relay 27 and thus the signal of the large-capacity DC electric power source voltage (V2) for commanding remote open magnetizes the coil of the terminal output relay 30 through the restriction switch 29 and gas pressure drop detection contact 43 which are closed while closing the contact of the closing relay 27.

Accordingly, the signal of the large-capacity DC electric power source voltage (V2) is supplied to the main relay 44 while closing the contact of the terminal output relay 30. At this time, the restriction switch 29 is in a closed position as far as the user does not manipulate it to an open position to prohibit the control output, and the gas pressure drop detection contact 43 is located at a closed position as far as an insulation gas pressure within the switch 1 is not reduced to less than a preset pressure.

As a result, electric power is supplied to the motor (not shown) which is an opening actuator while the coil of the main relay 44 is magnetized and the contact is closed, and the switch 1 in FIG. 1 is operated to a close position by the driving of the motor, thereby completing the command operation.

Next, the operation of controlling the field closing of the switch 1 in a state that the switch 1 of the multi circuit load break switch is currently in an open state and the user selectively manipulates a C-contact switch connected to the remote close command relay 11 and field closing switch 21 of the field/remote selection switch 23 to be connected to the remote close command relay 11 from the state illustrated in FIG. 2 will be described.

When a remote closing signal transmitted in a pulse signal form from the monitoring device (not shown) is transmitted, a contact of the remote close command relay 11 is closed in response to the remote closing signal to convert the remote closing signal into a signal of the large-capacity DC electric power source voltage (V2).

Then, a signal of the large-capacity DC electric power source voltage (V2) for commanding the close operation of the switch 1 is transferred to the trigger relay 26 through a C-contact switch connected to the remote close command relay 11 and field closing switch 21 at an upper portion of the field/remote selection switch 23 in the drawing and the closing diode 25. The subsequent operation will be carried out in a similar manner to the foregoing operation of controlling the field closing of the switch 1, and thus the description of redundant description will be omitted.

A control device of a multi circuit load break switch operated by the foregoing configuration according to the related art has a problem as described below.

In other words, a control device of a multi circuit load break switch according to the related art may use electrical circuit constituent elements other than electronic circuit constituent elements using a large-capacity DC electric power source voltage above DC 24 volts, and have a high rated voltage and thus the size and cost of the constituent elements may be larger and higher than those of the electronic elements, thereby increasing the cost of manufacturing the control device and the size thereof.

Furthermore, a control device of a multi circuit load break switch according to the related art may have a configuration in which the communication terminal device 10 and switching control device 20 are separately provided, and connected to each other by signal cables, and thus a lot of complicated signal cables may be wired, thereby causing inconvenience in the maintenance as well as increasing the space occupied by the multi circuit load break switch.

SUMMARY OF THE INVENTION

Accordingly, the present invention is contrived to solve the foregoing problems in the related art, and an object of the present invention is to provide a multi circuit load break switch in which the communication terminal device and switching control device are incorporated into a single unit and thus wiring between them is not required and the constituent elements are configured by electronic circuits using TTL (transistor-transistor logic) elements, thereby manufacturing the same at low cost as well as reducing the product size.

The object of the present invention may be accomplished by providing a control device of a multi circuit load break switch, comprising:

a first multiplexer configured to selectively provide an output signal according to a remote close signal or remote open signal;

a field closing switch configured to provide the user with a means capable of selectively commanding a close operation of the multi circuit load break switch at a field;

a field opening switch configured to provide the user with a means capable of selectively commanding an open operation of the multi circuit load break switch at a field;

a second multiplexer connected to the field closing switch and field opening switch to selectively provide a field closing switch actuation signal of the field closing switch or a field opening switch actuation signal of the field opening switch selected by the user;

a first exclusive-OR circuit unit connected to the first multiplexer and second multiplexer to output an open control signal indicating the open control of the multi circuit load break switch upon receiving only either one of the output signal according to the remote open signal from the first multiplexer and the field opening switch actuation signal from the second multiplexer;

a second exclusive-OR circuit unit connected to the first multiplexer and second multiplexer to output a close control signal indicating the close control of the multi circuit load break switch upon receiving only either one of the output signal according to the remote close signal from the first multiplexer and the field closing switch actuation signal from the second multiplexer;

an open command signal generation unit configured to generate and output an open command signal for commanding an open operation of the multi circuit load break switch;

a close command signal generation unit configured to generate and output a close command signal for commanding a close operation of the multi circuit load break switch;

a first photo coupler connected to the open command signal generation unit to provide an open state signal of the multi circuit load break switch to the open command signal generation unit to allow the open command signal generation unit to terminate the generating and outputting of the open command signal; and a second photo coupler connected to the close command signal generation unit to provide a close state signal of the multi circuit load break switch to the close command signal generation unit to allow the close command signal generation unit to terminate the generating and outputting of the close command signal According to an aspect of the present invention, the control device of a multi circuit load break switch according to the present invention may further comprising:

a state lock switch selectively driven to be open or closed by the user to output a state restriction signal for restricting the operation state of the multi circuit load break switch;

a first AND circuit unit provided between the first exclusive-OR circuit unit and the open command signal generation unit, having a first input terminal connected to an output terminal of the state lock switch and a second input terminal connected to an output terminal of the first exclusive-OR circuit unit, to output a signal for controlling the open command signal generation unit to be operated when there is no input of a state restriction signal and the first exclusive-OR circuit unit outputs the open control signal; and a second AND circuit unit provided between the second exclusive-OR circuit unit and the close command signal generation unit, having a first input terminal connected to the output terminal of the state lock switch and a second input terminal connected to the output terminal of the second exclusive-OR circuit unit, to output a signal for controlling the close command signal generation unit to be operated when there is no input of a state restriction signal and the second exclusive-OR circuit unit outputs the close control signal.

According to another aspect of the present invention, the control device of a multi circuit load break switch according to the present invention may further comprising:

a third photo coupler configured to receive a signal indicating the insulation gas pressure drop of the multi circuit load break switch;

an OR circuit unit, having a first input terminal connected to the output terminal of the open command signal generation unit and a second input terminal connected to the output terminal of the close command signal generation unit, to output the open command signal or the close command signal when the open command signal is received from the open command signal generation unit or the close command signal is received from the close command signal generation unit;

a third AND circuit, having a first input terminal connected to the third photo coupler and a second input terminal connected to the OR circuit unit, to terminate the output of the open command signal from the open command signal generation unit or the close command signal from the close command signal generation unit upon receiving a signal indicating the insulation gas pressure drop from the third photo coupler.

According to still another aspect of the present invention, the control device of a multi circuit load break switch may further comprising:

an terminal output relay configured to finally output the open command signal or the close command signal; and a semiconductor switch configured to be open or closed in response to the open command signal or the close command signal to magnetize or demagnetize the terminal output relay.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

The objective of the present disclosure, as well as the configuration and working effect thereof to accomplish the foregoing objective will be more clearly understood by the following description for the preferred embodiments of present disclosure with reference to the accompanying drawings.

The configuration of a multi circuit load break switch excluding a control device portion thereof according to the related art may be referred to as FIG. 1, and thus will be described with reference to FIGS. 1 and 3.

A control device of a multi circuit load break switch according to a preferred embodiment of the present invention may be configured to be provided in a printed circuit board accommodated into an enclosure (not shown) in which the functions of a communication terminal device and a switching control device are all integrated and unified in the communication terminal device 10 contrary to the related art.

The circuit configuration of a control device of a multi circuit load break switch according to a preferred embodiment of the present invention will be described below.

Figure 3:
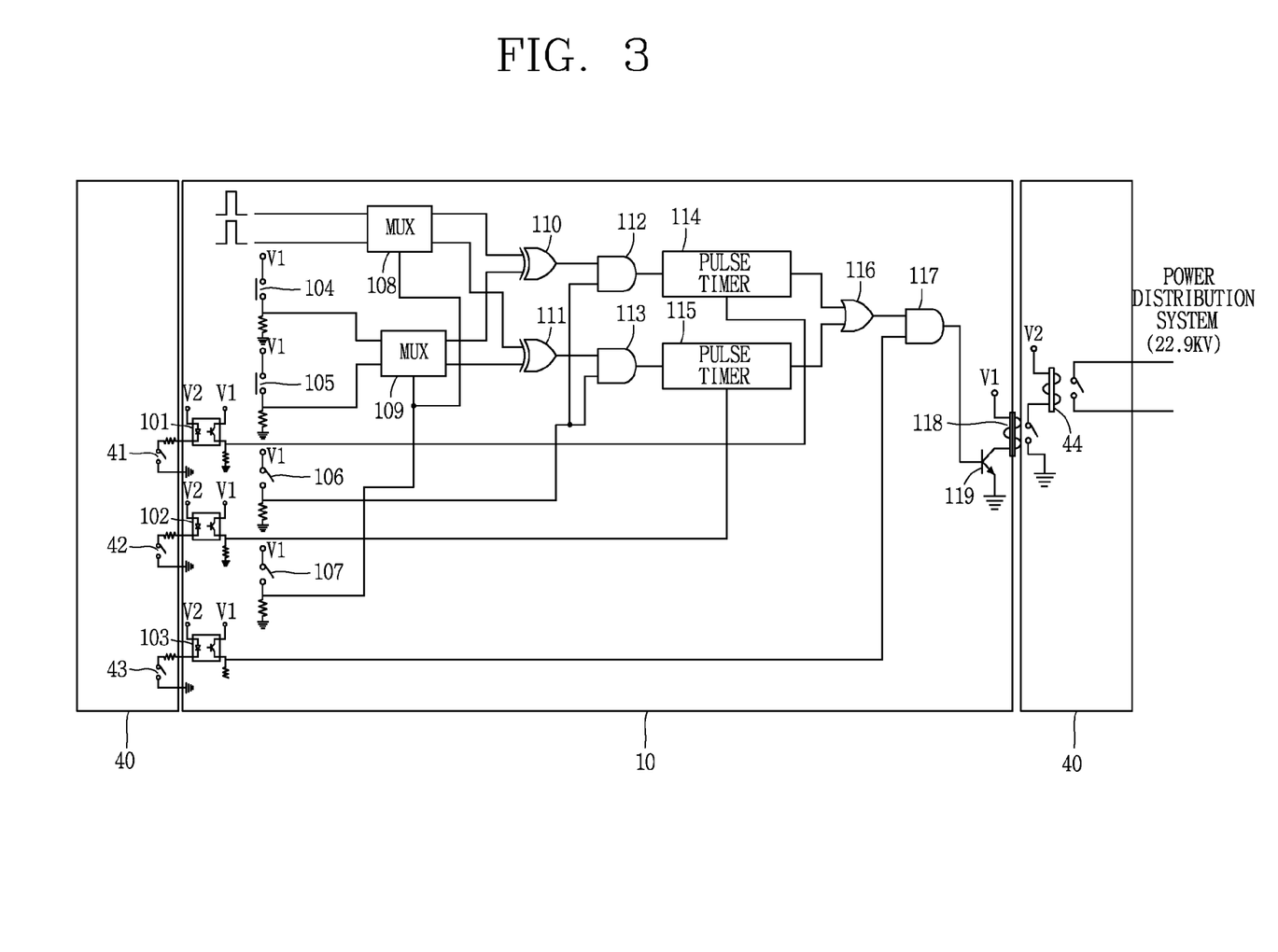
FIG. 3 is a circuit diagram illustrating the circuit configuration of a control device of a multi circuit load break switch according to a preferred embodiment of the present invention.

A control device of a multi circuit load break switch according to a preferred embodiment of the present invention may be configured with a communication terminal device 10 as illustrated in FIG. 3, and reference numeral 40 represents a switch actuator circuit unit controlled by the communication terminal device 10 in FIG. 3.

The switch actuator circuit unit 40 has a main relay 44, which is a main constituent element, that supplies or terminates electric power for driving a motor, for instance, as a switch actuator. In FIG. 3, the switch actuator circuit unit 40 may further include an open state detection contact 41 and a closed state detection contact 42 for detecting the operation state of the switch 1 in FIG. 1, an open state and a close state, respectively. Furthermore, the switch actuator circuit unit 40 may further include a gas pressure drop detection contact 43. The gas pressure drop detection contact 43 may be configured with a normal closed-contact (so called B-contact) switch configured to be open when an insulation gas pressure within the switch 1 is less than a pre-set allowable reference value and closed when it is normal.

The communication terminal device 10 configuring a control device of a multi circuit load break switch according to a preferred embodiment of the present invention includes a first multiplexer 108, a field closing switch 104, a field opening switch 105, a second multiplexer 109, a first exclusive-OR circuit unit 110, a second exclusive-OR circuit unit 111, an open command signal generation unit 114, a close command signal generation unit 115, a first photo coupler 101, and a second photo coupler 102.

The first multiplexer 108 selectively provide an output signal according to a remote close signal or remote open signal. The remote close signal or remote open signal may be transmitted in a pulse signal form through a wired or wireless communication path from a monitoring device (not shown) at a remote place, and the output signal being output from the first multiplexer 108 may be provided with a signal of digital logic "1".

The field closing switch 104 may provide a means capable of selectively commanding the close operation of the multi circuit load break switch at a field to the user, and may be configured with a push button switch, for instance. One end portion of the field closing switch 104 is connected to small-capacity DC electric power source with a small-capacity DC electric power source voltage (V1) less than several volts, for instance, and the other end portion of the field closing switch 104 is grounded through a resistor. The other end portion of the field closing switch 104 is also connected to an input terminal of the second multiplexer 109.

The field opening switch 105 may provide a means capable of selectively commanding the open operation of the multi circuit load break switch at a field to the user, and may be configured with a push button switch, for instance. One end portion of the field opening switch 105 is connected to small-capacity DC electric power source with a small-capacity DC electric power source voltage (V1) less than several volts, for instance, and the other end portion of the field opening switch 105 is grounded through a resistor. The other end portion of the field opening switch 105 is also connected to the other input terminal of the second multiplexer 109.

The second multiplexer 109 is connected to the field closing switch 104 and field opening switch 105 to selectively provide a field closing switch actuation signal of the field closing switch 104 or a field opening switch actuation signal of the field opening switch 105 selected by the user. Here, the field closing switch actuating signal and field opening switch actuation signal may be provided with a signal with digital logic "1".

The first exclusive-OR circuit unit 110 is connected to the first multiplexer 108 and second multiplexer 109 to output an open control signal indicating the open control of the multi circuit load break switch upon receiving only either one of the output signal according to the remote open signal from the first multiplexer 108 and the field opening switch actuation signal from the second multiplexer 109. Here, the open control signal may be provided with a signal with digital logic "1".

The second exclusive-OR circuit unit 111 is connected to the first multiplexer 108 and second multiplexer 109 to output a close control signal indicating the close control of the multi circuit load break switch upon receiving only either one of the output signal according to the remote close signal from the first multiplexer 108 and the field closing switch actuation signal from the second multiplexer 109. Here, the close control signal may be provided with a signal with digital logic "1".

The open command signal generation unit 114 generates and outputs an open command signal for commanding an open operation of the multi circuit load break switch.

The open command signal generation unit 114 may be preferably configured by a pulse generation circuit unit configured to generate and output a pulse signal in response to the close control signal of the first exclusive-OR circuit unit 110.

Furthermore, the open command signal generation unit 114 is connected to the open state detection contact 41 for detecting an open state of the multi circuit load break switch through the first photo coupler 101, and the open command signal generation unit 114 may preferably include a timer circuit unit to terminate the output of the open command signal in a pulse signal form unless an open state signal due to a closing operation of the open state detection contact 41 according to an open state of the multi circuit load break switch is received for a predetermined period of time subsequent to the output of the open command signal. Here, the open state signal may be provided with a small-capacity DC electric power source voltage (V1) less than several volts, for instance, and the close command signal may be provided with a signal with digital logic "1".

The close command signal generation unit 115 generates and outputs a close command signal for commanding a close operation of the multi circuit load break switch.

The close command signal generation unit 115 may be preferably configured by a pulse generation circuit unit configured to generates and outputs a pulse signal in response to the close control signal of the second exclusive-OR circuit unit 111.

Furthermore, the close command signal generation unit 115 is connected to the closed state detection contact 42 for detecting a closed state of the multi circuit load break switch through the second photo coupler 102, and the unit 115 may preferably include a timer circuit unit to terminate the output of the close command signal in a pulse signal form unless a close state signal due to a closing operation of the closed state detection contact 42 according to a closed state of the multi circuit load break switch is received for a predetermined period of time after the output of the close command signal. Here, the close state signal may be provided with a small-capacity DC electric power source voltage (V1) less than several volts, for instance.

The first photo coupler 101 is connected to the open command signal generation unit 114 to provide an open state signal of the multi circuit load break switch to the open command signal generation unit 114 so that the open command signal generation unit 114 may terminate outputting of the open command signal. Accordingly, when the open state signal of the multi circuit load break switch is received from the first photo coupler 101, the open command signal generation unit 114 terminates the generating and outputting of the open command signal. Here, the open state signal may be provided with a small-capacity DC electric power source voltage (V1) less than several volts, for instance.

The second photo coupler 102 is connected to the close command signal generation unit 115 to provide a close state signal of the multi circuit load break switch to the close command signal generation unit 115 so that the close command signal generation unit 115 may terminate the generating and outputting of the close command signal. Accordingly, when the close state signal of the multi circuit load break switch is received from the second photo coupler 102, the close command signal generation unit 115 terminates the generating and outputting of the close command signal. Here, the close state signal may be provided with a small-capacity DC electric power source voltage (V1) less than several volts, for instance, and the close command signal may be provided with a signal with digital logic "1".

On the other hand, according to a preferred aspect of the present invention, a control device of a multi circuit load break switch according to a preferred embodiment of the present invention may further include a state lock switch 106, a first AND circuit unit 112, and a second AND circuit unit 113.

The state lock switch 106 is a manual lock switch selectively driven to be open or closed by the user, and the state lock switch 106 outputs a state restriction signal for restricting the operation state of the multi circuit load break switch. Here, the restriction of the operation state refers to controlling the multi circuit load break switch to maintain a previous operation state. One end portion of the state lock switch 106 is connected to the DC electric power source of a small-capacity DC electric power source voltage (V1) less than several volts, and the other end portion, namely, output terminal of the state lock switch 106 is grounded through a resistor. The other end portion (output terminal) of the state lock switch 106 is connected to the first AND circuit unit 112 and second AND circuit unit 113 to transfer a signal with digital logic "1" or "0" according to the manual switching of the state lock switch 106 to the first AND circuit unit 112 and second AND circuit unit 113. Accordingly, when the user operates the state lock switch 106 to be open so as to command the multi circuit load break switch to maintain a previous operation state (namely, command state lock), a state restriction signal with digital logic "0" is transferred to the first AND circuit unit 112 and second AND circuit unit 113. When the user operates the state lock switch 106 to be closed so as to command the multi circuit load break switch to release the state restriction, a signal with digital logic "1" is transferred to the first AND circuit unit 112 and second AND circuit unit 113.

The first AND circuit unit 112 is provided between the first exclusive-OR circuit unit 110 and the open command signal generation unit 114. Furthermore, the first AND circuit unit 112 has a first input terminal connected to the output terminal of the state lock switch 106 and a second input terminal connected to the output terminal of the first exclusive-OR circuit unit 110. The first AND circuit unit 112 outputs a signal for controlling the open command signal generation unit 114 to be operated when there is no input of the state restriction signal (in other words, a signal with digital logic "1" is transferred to the first AND circuit unit 112 and second AND circuit unit 113) and the first exclusive-OR circuit unit 110 outputs a signal with digital logic "1" as the open control signal. Here, the signal for controlling the open command signal generation unit 114 may be provided with a signal with digital logic "1".

If there is an input of the state restriction signal (in other words, a signal with digital logic "0" is transferred to the first AND circuit unit 112 and second AND circuit unit 113) or there is no output of the open command signal from the first exclusive-OR circuit unit 110, namely, when the first exclusive-OR circuit unit 110 outputs a signal with digital logic "0", then the first AND circuit unit 112 outputs a signal with digital logic "0" for controlling the open command signal generation unit 114 to terminate the operation.

The second AND circuit unit 113 is provided between the second exclusive-OR circuit unit 111 and the close command signal generation unit 115. The second AND circuit unit 113 has a first input terminal connected to the output terminal of the state lock switch 106 and a second input terminal connected to the output terminal of the second exclusive-OR circuit unit 111. The second AND circuit unit 113 outputs a signal for controlling the close command signal generation unit 115 to be operated, namely, a signal with digital logic "1", when there is no input of the state restriction signal (in other words, a signal with digital logic "1" is transferred to the first AND circuit unit 112 and second AND circuit unit 113) and the second exclusive-OR circuit unit 111 outputs the close control signal.

If there is an input of the state restriction signal (in other words, a signal with digital logic "0" is transferred to the first AND circuit unit 112 and second AND circuit unit 113) or there is no output of the close command signal from the second exclusive-OR circuit unit 111, namely, when the second exclusive-OR circuit unit 111 outputs a signal with digital logic "0", then the second AND circuit unit 113 outputs a signal with digital logic "0" for controlling the close command signal generation unit 115 to terminate the operation.

On the other hand, according to another preferred aspect of the present invention, a control device of a multi circuit load break switch according to a preferred embodiment of the present invention may further include a third photo coupler 103, an OR circuit unit 116, and a third AND circuit unit 117.

An input terminal of the third photo coupler 103 is connected to the gas pressure drop detection contact 43 to receive a signal indicating the insulation gas pressure drop of the multi circuit load break switch, and an output terminal thereof is connected to the third AND circuit unit 117. Here, the gas pressure drop detection contact 43 may be configured with a normal close contact switch (in other words B-contact switch) configured to be open when an insulation gas pressure within the switch 1 in FIG. 1 is less than a pre-set allowable reference value and closed when it is normal.

Accordingly, the gas pressure drop detection contact 43 in FIG. 1 is open when an insulation gas pressure within the switch 1 is less than a pre-set allowable reference value and closed when it is normal, and therefore, a light-emitting portion of the third photo coupler 103 is emitted by the DC electric power source voltage (V2) and thus a transistor of the light-receiving portion of the third photo coupler 103 is turned on by receiving the light. Consequently, a signal with digital logic "1" based on the application of the small-capacity DC electric power source voltage (V1) less than several volts is output to the third AND circuit unit 117.

The OR circuit unit 116 has a first input terminal connected to the output terminal of the open command signal generation unit 114 and a second input terminal connected to the output terminal of the close command signal generation unit 115.

The OR circuit unit 116 outputs the open command signal or the close command signal as a signal with digital logic "1" when the open command signal given as a signal with digital logic "1" is received from the open command signal generation unit 114 or the close command signal given as a signal with digital logic "1" is received from the close command signal generation unit 115.

The third AND circuit unit 117 has a first input terminal connected to the output terminal of the OR circuit unit 116 and a second input terminal connected to the output terminal of the third photo coupler 103.

The third AND circuit unit 117 terminate the output of the open command signal from the open command signal generation unit 114 or the close command signal from the close command signal generation unit 115, namely, the output of an output signal from the OR circuit unit 116, upon receiving a signal with digital logic "0" indicating the insulation gas pressure drop from the third photo coupler 103.

Furthermore, according to still another preferred aspect of the present invention, a control device of a multi circuit load break switch according to a preferred embodiment of the present invention may further include an terminal output relay 118 and a semiconductor switch 119.

The terminal output relay 118 is a means configured to finally output the open command signal or the close command signal to the switch actuator circuit unit 40. The terminal output relay 118 may be configured with a coil a terminal of which is connected to the electric power source of a small-capacity DC electric power source voltage (V1) less than several volts, and the other terminal of which is connected to the semiconductor switch 119 and a contact configured to be open or closed according to the magnetization or demagnetization of the coil. An terminal of the contact of the terminal output relay 118 is connected to a large-capacity DC voltage (V2) through the coil of the main relay 44 of the switch actuator circuit unit 40 and the other terminal thereof is grounded.

Accordingly, when a signal with digital logic "1" is output from the third AND circuit unit 117 as the open command signal or close command signal, a small-capacity DC electric power source voltage (V1) is supplied to the coil of the terminal output relay 118 while turning on the semiconductor switch 119, and as a result, the contact is closed while magnetizing the coil of the terminal output relay 118.

The semiconductor switch 119 may be configured by a transistor, thyristor or the like, and the semiconductor switch 119 is closed (turned on) in response to a signal with digital logic "1" as the open command signal or close command signal from the third AND circuit unit 117 to magnetize the terminal output relay 118 or open (turned off) in response to a signal with digital logic "0" indicating that the open command signal or close command signal does not exist from the third AND circuit unit 117 to demagnetize the terminal output relay 118.

The operation of a control device of a multi circuit load break switch having the foregoing configuration according to a preferred embodiment of the present invention will be described with reference to FIGS. 1 and 3.

First, the operation of transmitting a remote open command signal in a pulse signal form through a wired or wireless communication path from the monitoring device (not shown) at a remote place will be described.

The first multiplexer 108 outputs a signal with digital logic "1" indicating an open command as the output signal according to the reception of the remote open command signal.

The first exclusive-OR circuit unit 110 that has received the signal with digital logic "1" indicating an open command from the first multiplexer 108 outputs a signal with digital logic "1" indicating a remote open command as an output signal unless an output signal with digital logic "1" of the second multiplexer 109 according to the user's manipulation of the field opening switch 105 or manipulation of the field closing switch 104 is received at the same time.

If the output signal with digital logic "1" of the second multiplexer 109 according to the user's manipulation of the field opening switch 105 or manipulation of the field closing switch 104 is received at the same time, then the first exclusive-OR circuit unit 110 outputs a signal with digital logic "0" as an output signal to nullify it.

The output signal with digital logic "1" outputted from the first exclusive-OR circuit unit 110 is transmitted to an input terminal of the first AND circuit unit 112, and in response to this, the first AND circuit unit 112 outputs a signal with digital logic "1" indicating a remote open command as the output signal unless a signal with digital logic "0" for commanding state lock manually selected by the user is received from the state lock switch 106 connected to the other input terminal thereof in response thereto, namely, when a signal with digital logic "1" according to the normal close state is received.

If a signal with digital logic "0" for commanding state lock manually selected by the user is received from the state lock switch 106, then the first AND circuit unit 112 outputs a signal with digital logic "0" for nullifying a remote open command as the output signal.

The output signal from the first AND circuit unit 112 is received at the open command signal generation unit 114, and the open command signal generation unit 114 generates and outputs or terminate an open command signal according to the output signal from the first AND circuit unit 112. In other words, when a signal with digital logic "1" is received from the first AND circuit unit 112, the open command signal generation unit 114 generates and outputs a signal with digital logic "1" as the open command signal until receiving a signal of several volts of DC voltage (V1) as the open state signal from the open state detection contact 41.

The open command signal generation unit 114 may include a timer circuit unit to terminate the generating and outputting of the open command signal unless an open state signal due to the closing operation of the open state detection contact 41 according to an open state of the multi circuit load break switch is received for a predetermined period of time subsequent to outputting of the open command signal.

The OR circuit unit 116 connected to an output terminal of the open command signal generation unit 114 outputs a signal with digital logic "1" as the output signal in response to the input of a signal with digital logic "1" as the open command signal.

The OR circuit unit 116 outputs a signal with digital logic "0" as the output signal unless a signal with digital logic "1" for commanding a close or open operation is received from both the open command signal generation unit 114 and close command signal generation unit 115 connected to two input terminals thereof, namely, when a signal with digital logic "0" is received from both the open command signal generation unit 114 and close command signal generation unit 115.

The third AND circuit unit 117 an input terminal of which is connected to an output terminal of the OR circuit unit 116 outputs a signal with digital logic "1" as the output signal in response to the signal with digital logic "1" from the OR circuit unit 116 unless a signal with digital logic "0" indicating a gas pressure drop is received from the gas pressure drop detection contact 43 connected to the other input terminal thereof through the third photo coupler 103, namely, when a signal with digital logic "1" indicating that the gas pressure is normal is received from the gas pressure drop detection contact 43.

When a signal with digital logic "0" indicating a gas pressure drop is received from the gas pressure drop detection contact 43 connected thereto through the third photo coupler 103, the third AND circuit unit 117 outputs a signal with digital logic "0" for nullifying a command signal.

The semiconductor switch 119 connected to an output terminal of the third AND circuit unit 117 is closed (turned on) in response to a signal with digital logic "1" as the open command signal or close command signal from the third AND circuit unit 117 to magnetize the terminal output relay 118 or open (turned off) in response to a signal with digital logic "0" indicating that the open command signal or close command signal does not exist from the third AND circuit unit 117 to demagnetize the terminal output relay 118.

When the semiconductor switch 119 is turned on, a small-capacity DC electric power source voltage (V1) is supplied to the coil of the terminal output relay 118, and as a result the contact is closed while magnetizing the coil of the terminal output relay 118.

The semiconductor switch 119 is open (turned off) in response to a signal with digital logic "0" indicating that the open command signal or close command signal does not exist from the third AND circuit unit 117 to demagnetize the terminal output relay 118.

When the contact is closed while magnetizing the coil of the terminal output relay 118, electric power is supplied to a driving source such as the motor which is not shown while magnetizing the main relay 44 of the switch actuator circuit unit 40, thereby performing an open operation for the multi circuit load break switch.

On the other hand, an operation of transmitting a remote close command signal in a pulse form through a wired or wireless communication path from the monitoring device (not shown) at a remote place will be described below.

The first multiplexer 108 outputs a signal with digital logic "1" indicating a close command as the output signal according to the reception of the remote close command signal.

The second exclusive-OR circuit unit 111 that has received the signal with digital logic "1" indicating a close command from the first multiplexer 108 outputs a signal with digital logic "1" indicating a remote close command as an output signal unless an output signal with digital logic "1" of the second multiplexer 109 according to the user's manipulation of the field opening switch 105 or manipulation of the field closing switch 104 is received at the same time.

If the output signal with digital logic "1" of the second multiplexer 109 according to the user's manipulation of the field opening switch 105 or manipulation of the field closing switch 104 is received at the same time, then the second exclusive-OR circuit unit 111 outputs a signal with digital logic "0" as an output signal to nullify it.

The output signal with digital logic "1" outputted from the second exclusive-OR circuit unit 111 is transmitted to one input terminal of the second AND circuit unit 113, and in response to this, the second AND circuit unit 113 outputs a signal with digital logic "1" indicating a remote close command as the output signal unless a signal with digital logic "0" for commanding state lock manually selected by the user is received from the state lock switch 106 connected to the other input terminal thereof in response thereto, namely, when a signal with digital logic "1" according to the closed state is received.

If a signal with digital logic "0" for commanding state lock manually selected by the user is received from the state lock switch 106, then the second AND circuit unit 113 outputs a signal with digital logic "0" as the output signal for nullifying a remote open command.

The output signal from the second AND circuit unit 113 is received at the close command signal generation unit 115, and the close command signal generation unit 115 generates and outputs or terminate a close command signal according to the output signal from the second AND circuit unit 113. In other words, when a signal with digital logic "1" is received from the second AND circuit unit 113, the close command signal generation unit 115 generates and outputs a signal with digital logic "1" as the close command signal until receiving a signal of several volts of DC voltage (V1) as the closed state signal from the closed state detection contact 42.

The close command signal generation unit 115 may include a timer circuit unit to automatically terminate generating and outputting of the close command signal unless a closed state signal due to the closing operation of the closed state detection contact 42 according to a closed state of the multi circuit load break switch is received for a predetermined period of time subsequent to outputting of the close command signal.

The OR circuit unit 116 connected to an output terminal of the close command signal generation unit 115 outputs a signal with digital logic "1" as the output signal in response to the input of a signal with digital logic "1" as the close command signal.

The OR circuit unit 116 outputs a signal with digital logic "0" as the output signal unless a signal with digital logic "1" for commanding a close or open operation is received from both the open command signal generation unit 114 and close command signal generation unit 115 connected to two input terminals thereof, namely, when a signal with digital logic "0" is received from both the open command signal generation unit 114 and close command signal generation unit 115.

The third AND circuit unit 117 one input terminal of which is connected to an output terminal of the OR circuit unit 116 outputs a signal with digital logic "1" as the output signal in response to the signal with digital logic "1" from the OR circuit unit 116 unless a signal with digital logic "0" indicating a gas pressure drop is received from the gas pressure drop detection contact 43 connected to the other input terminal thereof through the third photo coupler 103, namely, when a signal with digital logic "1" indicating that the gas pressure is normal is received from the gas pressure drop detection contact 43.

When a signal with digital logic "0" indicating a gas pressure drop is received from the gas pressure drop detection contact 43 connected thereto through the third photo coupler 103, the third AND circuit unit 117 outputs a signal with digital logic "0" for nullifying a command signal.

The semiconductor switch 119 connected to an output terminal of the third AND circuit unit 117 is closed (turned on) in response to a signal with digital logic "1" as the close command signal from the third AND circuit unit 117 to magnetize the terminal output relay 118.

When the semiconductor switch 119 is turned on, a small-capacity DC electric power source voltage (V1) is supplied to the coil of the terminal output relay 118, and as a result the contact is closed while magnetizing the coil of the terminal output relay 118.

When the contact is closed while magnetizing the coil of the terminal output relay 118, electric power is supplied to the driving source such as the motor (not shown) while magnetizing the main relay 44 of the switch actuator circuit unit 40, thereby performing a close operation for the multi circuit load break switch.

On the other hand, when the user manipulated the field opening switch 105 by press the corresponding push button, the operation of the control device of a multi circuit load break switch according to a preferred embodiment of the present invention will be described below.

The second multiplexer 109 outputs a signal with digital logic "1" indicating an open command as the output signal according to the reception of a small-capacity DC electric power source voltage (V1) due to the pressing of the field opening switch 105.

The first exclusive-OR circuit unit 110 that has received the signal with digital logic "1" indicating an open command from second multiplexer 109 outputs a signal with digital logic "1" indicating a field open command as an output signal unless an output signal with digital logic "1" of the first multiplexer 108 according to the reception of the remote open command signal or remote close signal is received at the same time.

If the output signal with digital logic "1" of the first multiplexer 108 according to the reception of the remote open command signal or remote close signal is received at the same time, then the first exclusive-OR circuit unit 110 outputs a signal with digital logic "0" as an output signal to nullify it.

The output signal with digital logic "1" outputted from the first exclusive-OR circuit unit 110 is transmitted to one input terminal of the first AND circuit unit 112, and in response to this, the first AND circuit unit 112 outputs a signal with digital logic "1" indicating a field open command as the output signal unless a signal with digital logic "0" for commanding state lock manually selected by the user is received from the state lock switch 106 connected to the other input terminal thereof in response thereto, namely, when a signal with digital logic "1" according to the closed state is received.

If a signal with digital logic "0" for commanding state lock manually selected by the user is received from the state lock switch 106, then the first AND circuit unit 112 outputs a signal with digital logic "0" for nullifying a field open command as the output signal.

The output signal from the first AND circuit unit 112 is received at the open command signal generation unit 114, and the open command signal generation unit 114 generates and outputs or terminate an open command signal according to the output signal from the first AND circuit unit 112. In other words, when a signal with digital logic "1" is received from the first AND circuit unit 112, the open command signal generation unit 114 generates and outputs a signal with digital logic "1" as the open command signal until receiving a signal of several volts of DC voltage (V1) as the open state signal from the open state detection contact 41.

The open command signal generation unit 114 may include a timer circuit unit to automatically terminate the generating and outputting of the open command signal unless an open state signal due to the closing operation of the open state detection contact 41 according to an open state of the multi circuit load break switch is received for a predetermined period of time subsequent to the outputting of the open command signal.

The subsequent operation will be carried out in a similar manner to the operation of receiving the foregoing remote open command signal, and thus the redundant description will be omitted.

On the other hand, when the user manipulated the field closing switch 104 by press the corresponding push button, the operation of the control device of a multi circuit load break switch according to a preferred embodiment of the present invention will be described below.

The second multiplexer 109 outputs a signal with digital logic "1" indicating a close command as the output signal according to the reception of a small-capacity DC electric power source voltage (V1) due to the pressing of the field closing switch 104.

The second exclusive-OR circuit unit 111 that has received the signal with digital logic "1" indicating a close command from second multiplexer 109 outputs a signal with digital logic "1" indicating a field close command as an output signal unless an output signal with digital logic "1" of the first multiplexer 108 according to the reception of the remote open command signal or remote close signal is received at the same time.

If the output signal with digital logic "1" of the first multiplexer 108 according to the reception of the remote open command signal or remote close signal is received at the same time, then the second exclusive-OR circuit unit 111 outputs a signal with digital logic "0" as an output signal to nullify it.

The output signal with digital logic "1" outputted from the second exclusive-OR circuit unit 111 is transmitted to one input terminal of the second AND circuit unit 113, and in response to this, the second AND circuit unit 113 outputs a signal with digital logic "1" indicating a field close command as the output signal unless a signal with digital logic "0" for commanding state lock manually selected by the user is received from the state lock switch 106 connected to the other input terminal thereof in response thereto, namely, when a signal with digital logic "1" according to the normal closed state is received.

If a signal with digital logic "0" for commanding state lock manually selected by the user is received from the state lock switch 106, then the second AND circuit unit 113 outputs a signal with digital logic "0" for nullifying a field close command as the output signal.

The output signal from the second AND circuit unit 113 is received at the close command signal generation unit 115, and the close command signal generation unit 115 generates and outputs or terminates a close command signal according to the output signal from the second AND circuit unit 113. In other words, when a signal with digital logic "1" is received from the second AND circuit unit 113, the close command signal generation unit 115 generates and outputs a signal with digital logic "1" as the close command signal until receiving a signal of several volts of DC voltage (V1) as the closed state signal from the closed state detection contact 42.

The close command signal generation unit 115 may include a timer circuit unit to automatically terminate the generating and outputting of the close command signal unless a closed state signal due to the closing operation of the closed state detection contact 42 according to a closed state of the multi circuit load break switch is received for a predetermined period of time subsequent to the outputting of the close command signal.

The subsequent operation will be carried out in a similar manner to the operation of receiving the foregoing remote open command signal, and thus the redundant description will be omitted.

As described above, in a control device of a multi circuit load break switch according to the present invention, the communication terminal device and switching control device may be incorporated into a communication terminal device 10 and thus the wiring of signal lines for signal communication between each other are not required, thereby obtaining an effect of reducing the size.

In a control device of a multi circuit load break switch according to the present invention, constituent elements thereof may be configured by electronic circuits using TTL (transistor-transistor logic) elements, thereby obtaining an effect of manufacturing the same at low cost as well as reducing the product size.

What is claimed is:

1. A control device of a multi circuit load break switch, comprising:
 a first multiplexer configured to selectively provide an output signal according to a remote close signal or remote open signal;
 a field closing switch configured to provide the user with a means capable of selectively commanding a close operation of the multi circuit load break switch at a field;
 a field opening switch configured to provide the user with a means capable of selectively commanding an open operation of the multi circuit load break switch at a field;
 a second multiplexer connected to the field closing switch and field opening switch to selectively provide a field closing switch actuation signal of the field closing switch or a field opening switch actuation signal of the field opening switch selected by the user;
 a first exclusive-OR circuit unit connected to the first multiplexer and second multiplexer to output an open control signal indicating the open control of the multi circuit load break switch upon receiving only either one of the output signal according to the remote open signal from the first multiplexer and the field opening switch actuation signal from the second multiplexer;
 a second exclusive-OR circuit unit connected to the first multiplexer and second multiplexer to output a close control signal indicating the close control of the multi circuit load break switch upon receiving only either one of the output signal according to the remote close signal from the first multiplexer and the field closing switch actuation signal from the second multiplexer;
 an open command signal generation unit configured to generate and output an open command signal for commanding an open operation of the multi circuit load break switch;
 a close command signal generation unit configured to generate and output a close command signal for commanding a close operation of the multi circuit load break switch;
 a first photo coupler connected to the open command signal generation unit to provide an open state signal of the multi circuit load break switch to the open command signal generation unit to allow the open command signal generation unit to terminate the generating and outputting of the open command signal; and
 a second photo coupler connected to the close command signal generation unit to provide a close state signal of the multi circuit load break switch to the close command signal generation unit to allow the close command signal generation unit to terminate the generating and outputting of the close command signal.

2. The control device of a multi circuit load break switch of claim 1, further comprising:
 a state lock switch selectively driven to be open or closed by the user to output a state restriction signal for restricting the operation state of the multi circuit load break switch;
 a first AND circuit unit provided between the first exclusive-OR circuit unit and the open command signal generation unit, having a first input terminal connected to an output terminal of the state lock switch and a second input terminal connected to an output terminal of the first exclusive-OR circuit unit, to output a signal for controlling the open command signal generation unit to be operated when there is no input of a state restriction signal and the first exclusive-OR circuit unit outputs the open control signal; and
 a second AND circuit unit provided between the second exclusive-OR circuit unit and the close command signal generation unit, having a first input terminal connected to the output terminal of the state lock switch and a second input terminal connected to the output terminal of the second exclusive-OR circuit unit, to output a signal for controlling the close command signal generation unit to be operated when there is no input of a state restriction signal and the second exclusive-OR circuit unit outputs the close control signal.

3. The control device of a multi circuit load break switch of claim 1, further comprising:
 a third photo coupler configured to receive a signal indicating the insulation gas pressure drop of the multi circuit load break switch;
 an OR circuit unit, having a first input terminal connected to the output terminal of the open command signal generation unit and a second input terminal connected to the output terminal of the close command signal generation unit, to output the open command signal or the close command signal when the open command signal is received from the open command signal generation unit or the close command signal is received from the close command signal generation unit;
 a third AND circuit, having a first input terminal connected to the third photo coupler and a second input terminal connected to the OR circuit unit, to terminate the output of the open command signal from the open command signal generation unit or the close command signal from the close command signal generation unit upon receiving a signal indicating the insulation gas pressure drop from the third photo coupler.

4. The control device of a multi circuit load break switch of claim 2, further comprising:
 a third photo coupler configured to receive a signal indicating the insulation gas pressure drop of the multi circuit load break switch;
 an OR circuit unit, having a first input terminal connected to the output terminal of the open command signal generation unit and a second input terminal connected to the output terminal of the close command signal generation unit, to output the open command signal or the close command signal when the open command signal is received from the open command signal generation unit or the close command signal is received from the close command signal generation unit;
 a third AND circuit, having a first input terminal connected to the third photo coupler and a second input terminal connected to the OR circuit unit, to terminate the output of the open command signal from the open command signal generation unit or the close command signal from the close command signal generation unit upon receiving a signal indicating the insulation gas pressure drop from the third photo coupler.

5. The control device of a multi circuit load break switch of claim 3, further comprising:

an terminal output relay configured to finally output the open command signal or the close command signal; and
a semiconductor switch configured to be open or closed in response to the open command signal or the close command signal to magnetize or demagnetize the terminal output relay.

6. The control device of a multi circuit load break switch of claim 4, further comprising:
an terminal output relay configured to finally output the open command signal or the close command signal; and
a semiconductor switch configured to be open or closed in response to the open command signal or the close command signal to magnetize or demagnetize the terminal output relay.

* * * * *